Jan. 6, 1959 J. B. BATCHELOR, JR 2,867,725
ELECTRONIC OSCILLATOR
Filed Feb. 20, 1956
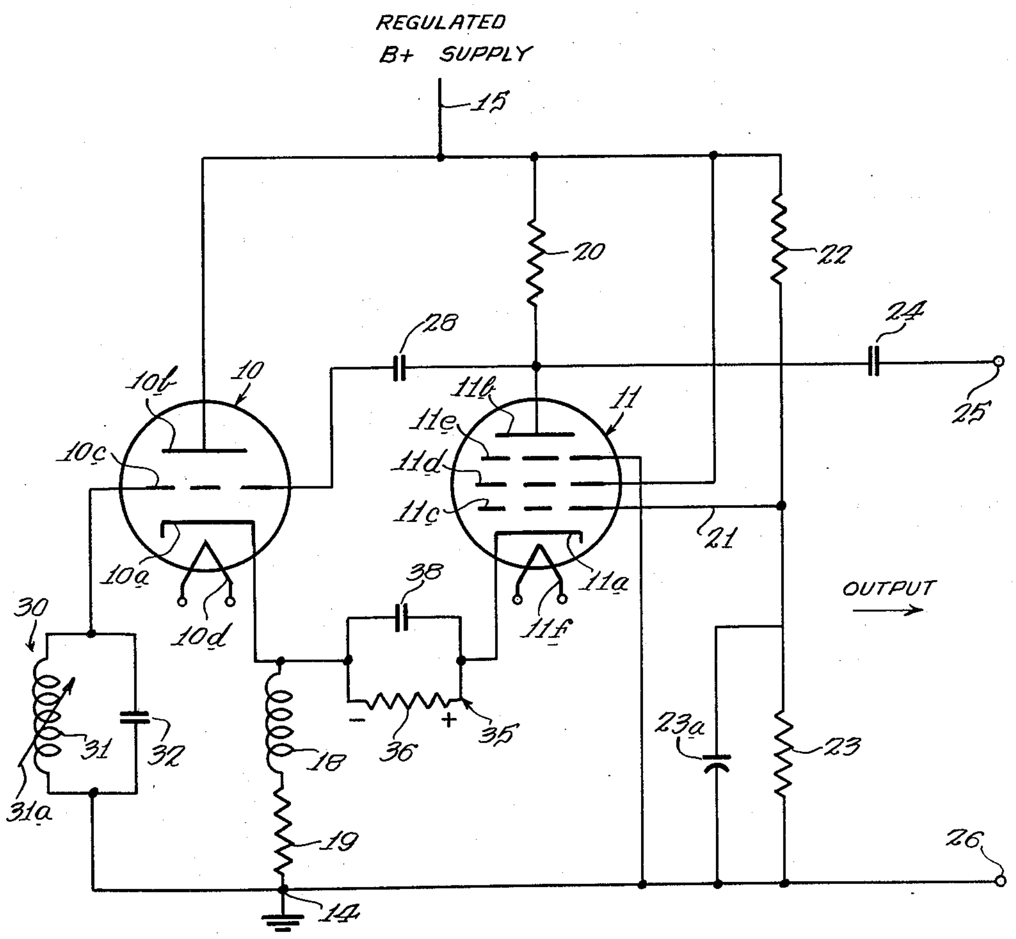
INVENTOR.
Joseph B. Batchelor Jr.
BY
Carlson, Pitzner, Hubbard & Wolfe
Attys.

United States Patent Office 2,867,725

Patented Jan. 6, 1959

2,867,725

ELECTRONIC OSCILLATOR

Joseph B. Batchelor, Jr., Monroe, Ga., assignor, by mesne assignments, to Patronix, Inc., Chicago, Ill., a corporation of Delaware Application February 20, 1956, Serial No. 566,426

4 Claims. (Cl. 250—36)

This invention relates in general to electronic oscillators, and in particular to improved oscillators operable with resonant circuits of relatively low Q.

In many communication installations, the need arises for a variable frequency oscillator which may be precisely tuned to produce a signal frequency of any desired value within a given range. For example, the local radio frequency oscillator in a transmitter or receiver for single sideband suppressed carrier signals must be susceptible of tuning over an entire communication band, the tuning dial or scale preferably being linearly calibrated to give accurately reproduceable frequency settings. A tuned circuit which has its anti-resonant frequency varied accurately and linearly with the rotation of a tuning knob and scale will, as a general rule, have a low Q. That is, tuned circuits with the desirable linearity and accuracy of adjustment are "lossy" and will, in a conventional oscillator circuit, dissipate so much energy that the loop gain will ordinarily be insufficient to sustain oscillations.

The general aim of the invention is to provide an electronic oscillator which oscillates under the influence of an associated frequency-controlling tuned circuit which has a very low Q and which, nevertheless, employs common, readily available electron discharge devices having only moderately high amplification factors. It is another object of the invention to provide such an oscillator which operates at smoothly adjustable frequencies under the control of a tuned circuit as the anti-resonant frequency of the latter is varied over a wide range; which produces substantially no harmonic signals; and which causes no appreciable heating of the elements in the tuned circuit and thus avoids frequency drift due to temperature changes.

A further object of the invention is to automatically stabilize the frequency of an oscillator at the value determined by an anti-resonant circuit, even though the transconductance of the electron discharge devices, e. g., vacuum tubes, changes for any reason such as aging of the cathode, or variations in cathode temperature due to fluctuations in filament voltage.

Other objects and advantages will become apparent as the following description proceeds, taken in conjunction with the accompanying drawing, in which the single figure is a schematic diagram of an oscillator circuit embodying the features of the invention.

While the invention has been shown and will be described in some detail with reference to a particular embodiment thereof, there is no intention that it thus be limited to such detail. On the contrary, it is intended here to cover all modifications, alterations, and equivalents falling within the spirit and scope of the invention as defined by the appended claims.

Referring now to the drawing, a preferred form of the novel oscillator has been illustrated as comprising first and second electron discharge devices 10 and 11. Each of these devices has at least a cathode 10*a*, 11*a*; an anode 10*b*, 11*b* and a control electrode 10*c*, 11*c*. In the present instance, the two discharge devices 10, 11 are conventional vacuum tubes, the first being, for example, a type 6J6 triode and the second being, for example, a type 6AU6 pentode. While the latter device may in some cases be a triode, in the present instance it is illustrated as a pentode and includes a screen grid 11*d* and a suppressor electrode 11*e*.

The two discharge devices 10, 11 are connected between a point of reference potential, here illustrated as a ground connection 14, and a source of constant positive potential here conventionally illustrated as a regulated B+ supply line 15. The first device is connected as a "cathode-follower" stage, and the second device is connected as a cathode driven "fixed-grid-potential" stage, the two stages being tandemly related by cathode coupling means. A feedback connection from the anode of the second device to the control electrode of the first device is provided.

More specifically, the first discharge device 10 is made to operate as a cathode-follower stage by a connection from its anode 10*b* directly to the positive voltage source 15, while its cathode 10*a* is connected to the point of reference potential 14 through an impedance made up of a series connected R. F. choke or inductance 18 and a resistor 19. Variations in the potential at the control electrode 10*c* will therefore be reproduced at the cathode 10*a*, the amplification being in the order of 1:1.

To establish the second discharge device 11*a* as a cathode driven fixed-grid-potential amplifier stage, the anode 11*b* is connected to the stabilized positive voltage source 15 through a load impedance or resistor 20, while the control electrode 11*c* is maintained at a fixed potential, slightly positive with respect to the reference or ground potential at 14, by means of a connection 21 to the junction of two resistors 22, 23 forming a voltage divider between the positive potential 15 and the reference potential 14. An R. F. by-pass capacitor 23*a* is connected in parallel with the resistor 23 to prevent R. F. potential variations at the control electrode 11*c*. The screen grid 11*d* may be connected directly to the regulated B+ potential at 15, and the suppressor electrode 11*e* may be connected directly to the ground or reference potential 14, as shown.

In order to drive the electron discharge device 11 with the output of the electron discharge device 10, the cathode 11*a* is connected to a point of reference potential or ground 14 through the common impedance formed by the inductance 18 and resistor 19. Variations in the potential of the cathode 10*a* thus cause corresponding variations in the potential of the cathode 11*a*, and since the potential of the control electrode 11*c* is fixed, current flow through the discharge device 11 will vary in accordance with the potential variations of the cathode 10*a*. Output signals appearing at the anode 11*b* may be taken through a coupling capacitor 24, appearing across output terminals 25, 26.

Regenerative feedback of proper phase from the device 11 to the device 10 is accomplished by a feedback path here shown simply as a capacitor 28 connected between the anode 11*b* and the control electrode 10*c*. As the control eletcrode 10*c* tends to have a more positive potential, therefore, the cathode 10*a* becomes more positive in potential, driving the cathode 11*a* more positive in potential so that current through the discharge device 11 decreases, the potential of the anode 11*b* increases, with the result that the control electrode 10*c* tends to be driven even more positive due to the regenerative feedback connection of the capacitor 28.

As an important aspect of the invention, a frequency-controlling anti-resonant circuit 30 is connected between the control electrode 10*c* and the point of reference potential represented by the ground connection at 14.

While this frequency-controlling circuit may take a variety of forms, it is here illustrated as made up of a variable inductance 31 paralleled with a capacitor 32. As a movable member 31a is adjusted, the value of the inductance 31 is varied, and the "parallel" or anti-resonant frequency of the circuit 30 will be changed. As previously noted, if the change in the anti-resonant frequency is linear with movement of the adjusting member 31a, the circuit 30 will in most cases have a relatively low Q.

Notwithstanding that low Q, the circuit as thus far described will produce continuous oscillations of a frequency determined by the adjustment of the inductance 31 because variations in the potential of the control electrode 10c are under the influence of the fly-wheel or "ringing" oscillation in the parallel circuit 30. In other words, as the anode 11b swings positive, the anti-resonant circuit 30 is "kicked," through the capacitor 28, so that oscillatory currents are produced therein. On the negative half cycles of such oscillation, the control electrode 10c will swing negative in the potential, and the regenerative feedback connection of the amplified signal appearing at the anode 11b will follow the control electrode 10c in potential, thus sustaining oscillation.

The size of the feedback capacitor, i. e., its impedance, is not especially critical. However, two considerations govern the choice of its size. First, the capacitor is made small enough such that when the anode 11b swings positive, the control electrode 10c does not exceed the D. C. bias on the cathode 10a occasioned by the D. C. voltage drop across to the cathode impedance 18, 19. Secondly, the lower the Q of the tuned circuit 30, the lower should be the impedance of the capacitor 28. This assures that sufficient energy is transferred into the tuned circuit to sustain oscillation despite losses therein.

The arrangement described oscillates even though the anti-resonant circuit 30 has a relatively low Q because essentially no "grid-current" flows between the cathode 10a and the control electrode 10c, the device operating as a Class A amplifier. The D. C. component of the current flow through the device 10 produces a voltage drop across the resistor 19 which thus holds the cathode 10a positive with respect to ground. This is the same as a negative bias for the control electrode 10c. Even at the peak of positive half cycles of the voltage wave at the upper end of the tuned circuit 30, the control electrode 10c does not reach a potential sufficiently positive with respect to the cathode 10a such that grid-current may flow. Thus, while oscillations are produced in the tuned circuit 30 by energy of proper phase supplied through the capacitor 28, they are of relatively low current amplitude. Accordingly, very little energy is dissipated in the anti-resonant circuit even though it has a low Q and would, with higher currents, consume a considerable amount of power. For this reason, the total gain of the closed loop formed by the tandemly connected cathode follower and fixed-grid-potential stages with a regenerative feed back connection is available to maintain the oscillating action. Moreover, since relatively little current flows through the components of the tuned circuit 30, they are not severely heated and there is little possibility of heat due to circulating current causing a shift in the value of the inductance 31. And because grid current does not flow, the oscillatory signal is almost perfectly sinusoidal, having essentially no harmonics or distortion.

Difficulties have been experienced in prior oscillators with changing or amplified interelectrode capacity, especially where such interelectrode capacity is so coupled to the anti-resonant circuit that variations in the former detune the latter. For example, it is known that the grid-plate capacity of an electron tube having a plate load impedance will vary with changes in the potential at the grid or control electrode. This is particularly noticeable at high frequencies and is termed the "Miller effect." It occurs because if the potential of the control grid increases, say by one volt, then the voltage between the control electrode and the anode increases 10 volts, assuming an amplification factor of 10. This voltage multiplication makes the grid-plate capacity "appear" ten times as big, i. e., makes that capacity appear to vary between its static value and a value multiplied by the amplification factor of the discharge device.

In the present arrangement, the device 10 is connected as a cathode follower. Thus, the potential of the anode 10b remains substantially constant with changes in potential of the control electrode 10c. Therefore, the capacity between the control electrode 10c and the anode 10b does not vary with changes in potential of the former and the "Miller effect" is eliminated. The grid-plate capacity, which at high frequencies is essentially in parallel with the anti-resonant circuit 30, thus does not vary and cannot cause detuning of the anti-resonant circuit from the selected frequency. Moreover, since the cathode 10a "follows" the control electrode 10c in potential, there is for practical purposes no voltage variation between them. Thus, no R. F. current can be transferred through the grid-cathode capacity, and the device 10 operates as if there were no stray capacity between the control electrode 10c and the cathode 10a. For this reason, the effect of the grid-cathode capacity, which otherwise would be effectively in parallel with the anti-resonant circuit 30, has practically no effect on the frequency of oscillation and cannot vary to detune the oscillator from a selected frequency of oscillation determined by the setting of the inductance member 31a. It will therefore be apparent that by making the device 10 as a cathode follower stage and connecting the anti-resonant circuit 30 between the control electrode 10c and cathode 10a, the undesirable effects of interelectrode capacities are eliminated.

In accordance with another feature of the invention, means are provided for maintaining the frequency of oscillation under direct control of the tuned circuit 30 even though the transconductance of the discharge device 10 and 11 might vary or drift. For example, with aging of the cathodes 10a or 11a, or with variations in the voltage applied to filaments 10d or 11f, the change in current flow through the devices 10 and 11, for a given variation in the potential of the control electrode 10c or the cathode 11a, would vary. This, in effect, would cause a change in the amplification factors so that the discharge devices would operate with different current values. In that event, the frequency of oscillation would drift from the desired value as determined by the setting of the adjustable member 31a.

In accordance with the invention, this difficulty is obviated by connecting a compensating impedance in series with the cathode 11a, between that electrode and the common cathode impedance formed by the inductance 18 and resistor 19. The compensating impedance is one which is effective primarily for D. C. or low frequency variations. For this purpose, it comprises a resistor 36 connected in parallel with an R. F. by-pass capacitor 38.

In operation, as the transconductance of the device 11 tends to decrease and the current therethrough correspondingly tends to decrease, due for example to a decrease in filament voltage, the D. C. voltage drops across the resistor 36 and the common impedance 18, 19 both tend to decrease. While the positive bias on the cathode 10a thus tends to decrease, the cathode 11a tends to go still less positive in potential since the resistor 36 is in series only with the latter. Because the control electrode 11c is fixed in potential, this drop in the potential of the cathode 11a tends to increase in a positive direction the effective bias of the control electrode. The more positive bias causes the current flow to increase, so that the transconductance device 11 is automatically returned or maintained at its original value notwithstanding the changes in filament voltage or aging of the cathode 11*a*.

If the transconductance of the device 10 should tend to decrease, thereby causing the current flowing through that device to decrease, the voltage drop across the resistor 19 will correspondingly tend to decrease. This will have the effect of lowering the potential of the cathode 10*a* and likewise lowering the potential of the cathode 11*a*. Accordingly, current will tend to increase through the device 11*b* producing a similar change of current amplitude at the anode 11*b* which, in turn, will be reflected at the control electrode 10*c*, rendering the latter more positive in potential so that current flow through the device 10 will be returned to its original value.

This automatic compensation action is, of course, substantially instantaneous, so that the effect of changes in transconductance of the two discharge devices 10 and 11 is eliminated. It will be understood that the same phenomenon occurs in the opposite sense whenever the transconductance of the two discharge devices tends, for any reason, to increase. An actual test with a circuit arranged as shown and operating at 5 megacycles has proved that the frequency is automatically maintained within 7 cycles per second of the original value, even if filament voltage for the two devices is varied between 4 and 8 volts, 6 volts being the normal filament voltage.

The over-all objectives of this improved oscillator are thus achieved. The circuit oscillates completely under the control of the low Q tuned circuit 30 without dissipating an appreciable amount of power therein, since no grid current flows between the control electrode 10*c* and the cathode 10*a*. Low power dissipation in the circuit 30 means that the devices 10 and 11 need not possess unusually high amplification factors, and that thermally induced drifts in frequency are avoided. Further, because grid current flow is eliminated, the oscillations in the anti-resonant circuit 30 are undistorted from a substantially pure sinusoidal form, and the output signal has very low harmonic content. Since the cathode follower connection of the device 10 eliminates the "Miller effect," the frequency of oscillation is not affected by changing interelectrode capacity, and is determined only by the anti-resonant circuit 30. Finally, owing to the automatic compensating action of the impedance 35, changes in the transconductances of the discharge device 11 are prevented from causing any drift in the frequency of oscillation from that value determined by the setting of the variable inductance 31. A scale calibrated directly in frequency and associated with the movable element of the inductance 31 thus enables accurate, reproduceable frequency settings, even though the discharge devices age or their filament voltage varies.

I claim as my invention:

1. An oscillator comprising, in combination, first and second electron discharge devices each having at least an anode, cathode and control electrode, means tandemly connecting said two devices respectively as "cathode follower" and "fixed-grid-potential" stages including a common impedance connected in series between both of the cathodes and a point of reference potential, an anti-resonant impedance connected between the control electrode of said first device and said point of reference potential, a feedback connection between the anode of said second device and the control electrode of said first device, and a compensating impedance interposed in series between said common impedance and the cathode of said second device to maintain the frequency of oscillation substantially constant notwithstanding changes in the transconductance of said second device.

2. An oscillator comprising the combination of first and second electron discharge devices each having at least an anode, cathode and control electrode, a common impedance connected in series with both said cathodes to a point of reference potential, means for connecting the anode of the first device directly to a positive voltage source to establish the first device as a "cathode follower" stage, a load impedance for connecting the anode of said second device to the positive voltage source, means for holding the control electrode of said second device at a fixed bias potential to establish said second device as a "fixed-grid-potential" stage, an A. C. feedback connection between the anode of said second device and the control electrode of said first device, a tunable anti-resonant circuit connected between the control electrode of said first device and said point of reference potential, and a resistor interposed between said common impedance and the cathode of said second device to automatically compensate for changes in transconductance of the latter.

3. A variable frequency oscillator comprising, in combination, first and second electron discharge devices each having an anode, cathode and control electrode, means for directly connecting the anode of said first device to a positive voltage source and an impedance for connecting its cathode to a point of reference potential, a load impedance for connecting the anode of said second device to the positive voltage source and means for holding its control electrode at a fixed potential, a capacitor connected between the anode of said second device and the control electrode of said first device, an anti-resonant circuit including a variable inductance in parallel with a capacitor connected between the control electrode of said first device and said point of reference potential, and a resistor paralleled with a by-pass capacitor connected between said cathodes so that the first device as a "cathode follower" drives the second device as a "fixed-grid-potential" amplifier to sustain oscillations in said anti-resonant circuit.

4. A sinusoidal oscillator comprising two electron discharge devices each having an anode, cathode and control electrode, means for connecting the anode of said first device directly to one side of a direct voltage source and a cathode impedance for connecting the cathode of said first device to the other side of said source, a load impedance for connecting the anode of said second device to said one side of said source, means connecting the cathode of said second device to the cathode of the first device, means connecting the control electrode of said second device to a point of fixed potential, a feedback connection from the anode of the second device to the control electrode of the first device, and a tunable anti-resonant circuit connected between the control electrode of said first device and that end of said cathode impedance which is remote from said cathodes.

References Cited in the file of this patent

UNITED STATES PATENTS

| | | |
|---|---|---|
| 2,444,084 | Artzt | June 29, 1948 |
| 2,553,165 | Bliss | May 15, 1951 |
| 2,568,533 | Artzt | Sept. 18, 1951 |
| 2,761,970 | Owens | Sept. 4, 1956 |

FOREIGN PATENTS

| | | |
|---|---|---|
| 535,778 | Great Britain | Apr. 22, 1941 |
| 123,410 | Australia | Jan. 24, 1947 |
| 258,470 | Switzerland | May 16, 1949 |